(12) United States Patent
Stuber et al.

(10) Patent No.: US 9,331,098 B2
(45) Date of Patent: May 3, 2016

(54) SEMICONDUCTOR-ON-INSULATOR INTEGRATED CIRCUIT WITH REDUCED OFF-STATE CAPACITANCE

(71) Applicant: QUALCOMM SWITCH CORP., San Diego, CA (US)

(72) Inventors: Michael A. Stuber, Carlsbad, CA (US); Stuart B. Molin, Carlsbad, CA (US); Chris Brindle, Poway, CA (US)

(73) Assignee: QUALCOMM SWITCH CORP., San Diego, CA (US)

( * ) Notice: Subject to any disclaimer, the term of this patent is extended or adjusted under 35 U.S.C. 154(b) by 52 days.

(21) Appl. No.: 14/335,906

(22) Filed: Jul. 19, 2014

(65) Prior Publication Data

US 2014/0327077 A1 Nov. 6, 2014

Related U.S. Application Data

(63) Continuation of application No. 14/272,261, filed on May 7, 2014, which is a continuation of application No. 13/851,926, filed on Mar. 27, 2013, now Pat. No. 8,748,245.

(51) Int. Cl.
*H01L 23/48* (2006.01)
*H01L 23/52* (2006.01)
*H01L 29/40* (2006.01)
(Continued)

(52) U.S. Cl.
CPC ............ *H01L 27/1203* (2013.01); *H01L 21/84* (2013.01); *H01L 23/481* (2013.01); *H01L 2924/0002* (2013.01)

(58) Field of Classification Search
USPC .................................. 257/774, 447, 458, 460
See application file for complete search history.

(56) References Cited

U.S. PATENT DOCUMENTS

| 4,505,799 A | 3/1985 | Baxter |
| 4,819,037 A | 4/1989 | Sakakibara et al. |
| 4,897,123 A | 1/1990 | Mitsui |

(Continued)

FOREIGN PATENT DOCUMENTS

| CN | 1470073 A | 1/2004 |
| CN | 1729578 A | 2/2006 |

OTHER PUBLICATIONS

Office Action dated Dec. 31, 2014 for U.S. Appl. No. 13/860,371.
(Continued)

*Primary Examiner* — Marc Armand
*Assistant Examiner* — Wilner Jean Baptiste
(74) *Attorney, Agent, or Firm* — Haynes and Boone, LLP (57) ABSTRACT

An integrated circuit assembly comprises an insulating layer, a semiconductor layer, a handle layer, a metal interconnect layer, and transistors. The insulating layer has a first surface, a second surface, and a hole extending from the first surface to the second surface. The semiconductor layer has a first surface and a second surface, the first surface of the semiconductor layer contacting the first surface of the insulating layer. The handle layer is coupled to the second surface of the semiconductor layer. The metal interconnect layer is coupled to the second surface of the insulating layer, the metal interconnect layer being disposed within the hole in the insulating layer. The transistors are located in the semiconductor layer. The hole in the insulating layer extends to at least the first surface of the semiconductor layer. The metal interconnect layer electrically couples a plurality of the transistors to each other.

30 Claims, 9 Drawing Sheets

(51) Int. Cl.
H01L 27/12 (2006.01)
H01L 21/84 (2006.01)

(56) References Cited

U.S. PATENT DOCUMENTS

| | | | |
|---|---|---|---|
| 4,959,697 | A | 9/1990 | Shier et al. |
| 5,122,856 | A | 6/1992 | Komiya |
| 5,198,379 | A | 3/1993 | Adan |
| 5,212,397 | A | 5/1993 | See et al. |
| 5,266,515 | A | 11/1993 | Robb et al. |
| 5,571,741 | A | 11/1996 | Leedy |
| 5,580,802 | A | 12/1996 | Mayer et al. |
| 5,619,054 | A | 4/1997 | Hashimoto |
| 5,907,169 | A | 5/1999 | Hshieh et al. |
| 6,004,837 | A | 12/1999 | Gambino et al. |
| 6,060,746 | A | 5/2000 | Bertin et al. |
| 6,084,284 | A | 7/2000 | Adamic, Jr. |
| 6,130,457 | A | 10/2000 | Yu et al. |
| 6,143,582 | A | 11/2000 | Vu et al. |
| 6,153,912 | A | 11/2000 | Holst |
| 6,335,214 | B1 | 1/2002 | Fung |
| 6,337,505 | B2 | 1/2002 | Hwang et al. |
| 6,346,446 | B1 | 2/2002 | Ritenour |
| 6,521,940 | B1 | 2/2003 | Vu et al. |
| 6,611,023 | B1 | 8/2003 | En et al. |
| 6,700,160 | B1 | 3/2004 | Merchant |
| 6,753,579 | B2 | 6/2004 | Baba |
| 6,927,102 | B2 | 8/2005 | Udrea et al. |
| 7,250,347 | B2 | 7/2007 | Furukawa et al. |
| 7,427,803 | B2 | 9/2008 | Chao et al. |
| 7,491,588 | B2 | 2/2009 | Campbell et al. |
| 7,525,151 | B2 | 4/2009 | Haase |
| 7,576,404 | B2 | 8/2009 | Wilson et al. |
| 7,638,836 | B2 | 12/2009 | Walker |
| 7,651,897 | B2 | 1/2010 | Vashchenko et al. |
| 7,719,033 | B2 | 5/2010 | Jeong et al. |
| 8,030,145 | B2 | 10/2011 | Chang et al. |
| 8,072,006 | B1 | 12/2011 | Hackler, Sr. et al. |
| 8,384,425 | B2 | 2/2013 | Mazure et al. |
| 8,415,743 | B2 | 4/2013 | Cai et al. |
| 8,426,888 | B2 | 4/2013 | Molin et al. |
| 8,518,758 | B2 | 8/2013 | Yang et al. |
| 8,530,287 | B2 | 9/2013 | Cai et al. |
| 8,581,349 | B1 | 11/2013 | Sekar et al. |
| 8,642,416 | B2 | 2/2014 | Or-Bach et al. |
| 8,664,712 | B2 | 3/2014 | Mazure et al. |
| 8,748,245 | B1 | 6/2014 | Stuber et al. |
| 8,928,068 | B2 | 1/2015 | Molin et al. |
| 2003/0017646 | A1 | 1/2003 | Sridharan et al. |
| 2004/0061163 | A1 | 4/2004 | Nakayama |
| 2004/0106335 | A1 | 6/2004 | Nemoto et al. |
| 2004/0113051 | A1 | 6/2004 | Kim et al. |
| 2004/0119076 | A1 | 6/2004 | Ryu |
| 2005/0242369 | A1 | 11/2005 | Udrea et al. |
| 2005/0253175 | A1 | 11/2005 | Taddiken |
| 2006/0043436 | A1 | 3/2006 | Fan et al. |
| 2006/0068532 | A1 | 3/2006 | Schuele et al. |
| 2007/0152269 | A1 | 7/2007 | Haase |
| 2007/0284360 | A1 | 12/2007 | Santoruvo et al. |
| 2007/0284628 | A1 | 12/2007 | Kapoor |
| 2008/0054313 | A1 | 3/2008 | Dyer et al. |
| 2009/0050969 | A1 | 2/2009 | Takasu |
| 2009/0194817 | A1 | 8/2009 | Lee et al. |
| 2010/0078776 | A1 | 4/2010 | Barth et al. |
| 2010/0230735 | A1 | 9/2010 | Zhu |
| 2010/0315580 | A1* | 12/2010 | Cho .................. H01L 27/12 349/116 |
| 2011/0012199 | A1 | 1/2011 | Nygaard et al. |
| 2011/0254092 | A1 | 10/2011 | Yang et al. |
| 2012/0088339 | A1 | 4/2012 | Molin et al. |
| 2012/0231620 | A1 | 9/2012 | Kuroda |
| 2013/0049215 | A1 | 2/2013 | Larsen |
| 2014/0342529 | A1 | 11/2014 | Goktepeli et al. |
| 2015/0137307 | A1 | 5/2015 | Stuber |

OTHER PUBLICATIONS

Office Action dated Jan. 16, 2015 for U.S. Appl. No. 14/451,342.
Office Action dated Jan. 8, 2015 for U.S. Appl. No. 14/272,261.
Berriah et al, Thermal Analysis of a Miniature Electronic Power Device Matched to a Silicon Wafer, NEWCAS Conference, 2010 8th IEEE International, Jun. 20-23, 2010, pp. 129-132.
Burns et al., Three-Dimensional Integrated Circuits for Low-Power, High-Bandwidth Systems on a Chip, Solid-State Circuits Conference, Feb. 2001, Digest of Technical Papers, pp. 268-276.
Chen et al., Effects of Through-BOX Vias on SOI MOSFETs, VLSI Technology, Systems and Applications, IEEE, Apr. 21-23, 2008, pp. 95-96.
Chung et al., "A New SOI MOSFET Structure with Junction Type Body Contact", School of Electrical Engineering & ISRC, Electron Devices Meeting, Dec. 1999, pp. 59-62, Seaoul National University, Kwanak-Gu, Seoul Korea.
Chung, Y. et al., "SOI MOSFET Structure with a Junction-Type Body Contact for Suppression of Pass Gate Leakage", IEEE Transactions on Electron Devices, Jul. 2011, pp. 1360-1365, vol. 48, No. 7.
International Search Report dated May 11, 2012 for PCT Application PCT/US2011/055671.
Notice of Allowance and Fees dated Feb. 6, 2014 for U.S. Appl. No. 13/851,926.
Notice of Allowance and Fees Due dated Jan. 22, 2013 for U.S. Appl. No. 13/270,339.
Office Action Dated Dec. 13, 2012 for U.S. Appl. No. 13/270,335.
Office Action dated Dec. 10, 2012 for U.S. Appl. No. 13/270,339.
Office Action dated Feb. 17, 2012 for U.S. Appl. No. 13/270,339.
Office Action dated Jan. 30, 2014 for U.S. Appl. No. 13/857,136.
Office Action dated Jun. 29, 2012 for U.S. Appl. No. 13/270,339.
Office Action dated Oct. 25, 2012 for U.S. Appl. No. 13/270,339.
Qin et al., A study of nickel silicide film as a mechanical material, Sensors and Actuators A: Physical, vol. 87, Issues 1-2 Dec. 1, 2000, pp. 95-95.
U.S. Appl. No. 14/272,261, filed May 7, 2014 entitled Semiconductor-on-Insulator integrated Circuit with Interconnect Below the Insulator.
Nenadovic et al., RF Power Silicon-On-Glass VDMOSFETs, IEEE Electron Device Letters, vol. 25, No. 6, Jun. 2004, pp. 424-426.
Office Action dated Aug. 12, 2015 for U.S. Appl. No. 14/272,261.
Office Action dated Jun. 30, 2015 for Chinese Patent Application No. 201180059579.3.
Supplementary Partial European Search Report dated Jul. 31, 2015 for European Patent Application No. EP 11833222.
International Search Report and Written Opinion dated Aug. 4, 2014 for PCT Patent Application No. PCT/US2014/030553.
Notice of Allowance and Fees dated Sep. 4, 2014 for U.S. Appl. No. 13/857,136.
Notice of Allowance dated May 15, 2015 for U.S. Appl. No. 13/860,371.
Office Action dated Aug. 4, 2015 for U.S. Appl. No. 14/451,342.
Notice of Allowance for U.S. Appl. No. 14/824,491, mailed Oct. 5, 2015, 57 pages.
Yang Y., et al., "Read-Preferred SRAM with Write-Assist Circuit Using Back-Gate ETSOI Transistors in 22-nm Technology", IEEE Transactions on Electron Devices, vol. 59, Issue 10, Oct. 2012, pp. 2575-2581.

* cited by examiner

SEMICONDUCTOR-ON-INSULATOR INTEGRATED CIRCUIT WITH REDUCED OFF-STATE CAPACITANCE

CROSS-REFERENCE TO RELATED APPLICATIONS

This application is a continuation of U.S. application Ser. No. 14/272,261, filed May 7, 2014, which is a continuation of U.S. application Ser. No. 13/851,926, now U.S. Pat. No. 8,748,245, filed Mar. 27, 2013, all of which are hereby incorporated by reference herein in their entirety.

BACKGROUND OF THE INVENTION

In an integrated circuit, metal lines typically connect individual circuit elements together. The nature of this metal interconnect critically affects the performance and cost of the integrated circuit product. For example, most integrated circuit processes offer multiple levels of metal interconnect, in order to allow the maximum flexibility in circuit layout. This layout flexibility allows a designer to minimize the size of an integrated circuit, for example, reducing the cost of the product.

Figure 1:
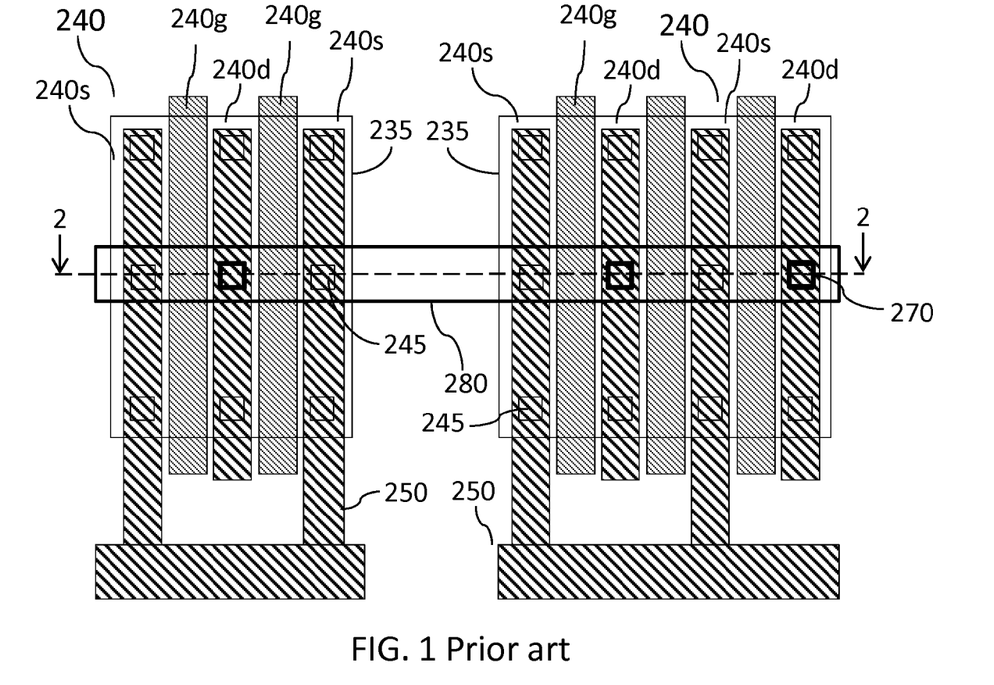
FIG. 1 illustrates a typical integrated circuit layout with two layers of metal.

An example of a typical circuit layout with two levels of metal interconnect is shown in FIG. 1. This layout includes two metal-oxide-semiconductor field effect transistors (MOSFET) 240. Isolation edges 235 and gate fingers 240g define the transistors. One of the transistors 240 has two gate fingers 240g and one has three gate fingers. The gate shapes 240g and isolation edges 235 determine the source and drain regions of the transistors (240s and 240d, respectively). The drains 240d of both transistors 240 are electrically connected together, through contacts 245, first metal lines 250, inter-metal vias 270, and second metal line 280. The source regions 240s of the two transistors are connected individually through contacts 245 and first metal lines 250. The layout of FIG. 1 could be, for example, a complementary metal-oxide-semiconductor (CMOS) inverter, if one of the transistors 240 is an n-channel MOSFET and the other is a p-channel MOSFET.

In most multi-level metallization schemes, to connect upper-level metal lines to lower level metal lines or transistor electrodes (sources, drains, and gates), all of the intermediate metal layers and contacts or vias must be used. This can be seen in FIG. 1, where the second level metal line 280 is connected to transistor drains 240d through the first metal layer 250 and metal/diffusion contact 245. Thus, to connect source fingers 240s together, for example, a metal line 250 runs outside the transistor area to avoid shorting transistor sources 240s and drains 240d together. This increases the height, and thus the area, of the layout. Moreover, the width of this layout is determined by the minimum pitch of the contacted first metal lines, or the minimum pitch of the contacted source/drain regions—whichever is greater. If the minimum pitch of the contacted first metal lines is the greater of the two pitches, then this layout may be reduced in width by an alternative metallization scheme. Note that the minimum pitch of the contacted metal lines may be determined by lithographic or other process considerations, or it may be determined by electromigration concerns or other considerations/concerns.

The resistance (per unit length) and capacitance (per unit area) of the metal interconnect layers often has a direct impact on the performance of an integrated circuit. The interconnect structures and materials used affect, in turn, the resistance and capacitance of the interconnect lines. For example, the capacitance between a given interconnect line and the semiconductor substrate, or the capacitance between two interconnect lines, decreases as the vertical distance between them increases. If multiple interconnect layers are available, critical capacitances can be reduced by placing their nodes on metal layers that have more vertical separation between them.

Figure 2:
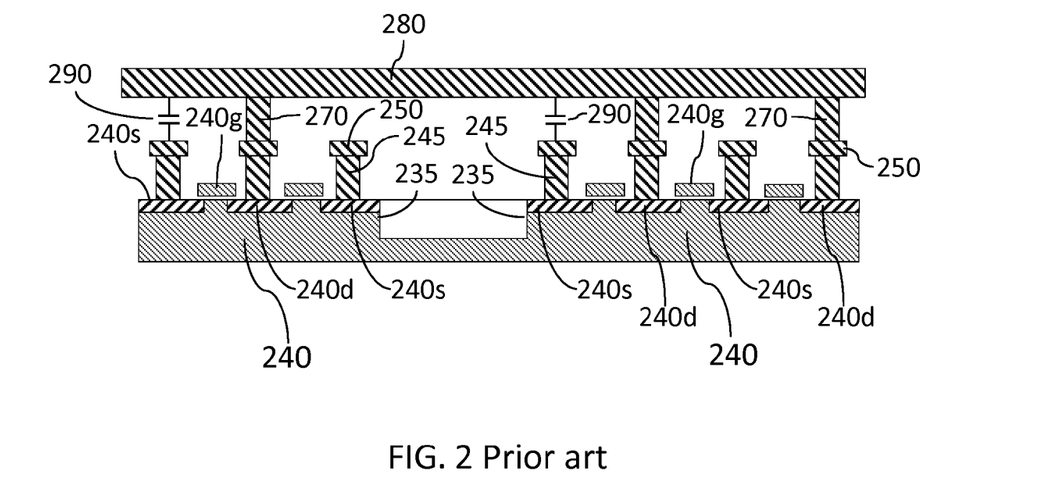
FIG. 2 illustrates a cross-section of the circuit layout shown in FIG. 1.

To illustrate the origin of these parasitic capacitances, a cross-section of the layout of FIG. 1 is shown in FIG. 2. Parasitic capacitances, for example, between the gates 240g and the drain regions 240d (gate-drain capacitance) and the source 240s and drain 240d regions (off-state capacitance), are determined partly by the interconnect structure. For example, the overlap area between the first metal lines 250 and the source regions 240s forms a component of the off-state parasitic capacitance 290. The capacitance between the contact metal 245 and the transistor gates 240g contributes to the total gate-drain parasitic capacitance. Thus, the metallization scheme and layout has an effect on circuit parasitic capacitances, and therefore circuit performance.

These parasitic effects are important for high frequency and high-speed circuits. Such circuits are often implemented on semiconductor-on-insulator (SOI) technology, which was first commercialized in the late 1990s. The defining characteristic of SOI technology is that the semiconductor region in which circuitry is formed is isolated from bulk substrate by an electrically insulating layer. This insulating layer is typically silicon dioxide. The advantageous aspects of SOI technology stem directly from the ability of the insulator layer to electronically isolate the active layer from bulk substrate.

SOI technology represents an improvement over traditional bulk substrate technology because the introduction of the insulating layer isolates the active devices in an SOI structure, which improves their electrical characteristics. For example, parasitic capacitances within the semiconductor region—depletion and diffusion capacitances, for example—are often reduced in SOI devices, especially those with thin enough semiconductor layers such that the transistors are "fully-depleted." Short-channel effects—the variation of the threshold voltage of a transistor with its channel length—are also reduced in SOI devices. For these reasons, among others, SOI is often the technology of choice for high-speed, low-power circuits. In addition, the SOI's insulating layer can act to shield the active devices from harmful radiation. This is particularly important for integrated circuits that are used in space given the prevalence of harmful ionizing radiation outside the earth's atmosphere.

Like bulk-substrate technologies, SOI technologies may also make use of multiple layers of metal interconnect. If these metal layers can be formed in such a way as to take advantage of the unique structure of SOI, cost and performance benefits can result. These performance benefits may be especially desirable for the types of circuits typically fabricated on SOI technologies—high-speed or high switching frequency, low-loss circuits.

SUMMARY OF THE INVENTION

An integrated circuit assembly comprising a transferred silicon-on-insulator structure is described. The structure comprises an insulating layer having a first surface and a second surface, and a hole extending from the first surface to the second surface. A semiconductor layer has a first surface and a second surface, and its first surface contacts the first surface of the insulating layer. The semiconductor layer contains active or reactive circuit elements. A metal interconnect layer is coupled to the second surface of the insulating layer, the metal interconnect layer being disposed within the hole in the insulating layer. The hole in the insulating layer extends to at least the first surface of the semiconductor layer, and the metal interconnect layer electrically couples a plurality of the active or reactive circuit elements together.

A method of forming a transferred semiconductor-on-insulator integrated circuit is described. The semiconductor-on-insulator includes an insulating layer having a first surface and a second surface, a semiconductor layer having a first surface and a second surface, and a substrate layer. The first surface of the semiconductor layer contacts the first surface of the insulating layer. The substrate layer contacts the second surface of the insulating layer. Active or reactive circuit elements are formed in the semiconductor layer. A handle layer is coupled to the second surface of the semiconductor layer. The substrate layer is removed, and a hole extending from the second surface of the insulator layer to its first surface is formed in the insulating layer. The hole exposes the first surface of the semiconductor layer. A metal interconnect layer is formed on the second surface of the insulator layer and inside the hole in the insulator layer. The metal interconnect layer electrically couples a plurality of the active or reactive circuit elements to each other.

DETAILED DESCRIPTION OF THE EMBODIMENTS

High-speed, high performance integrated circuits are often fabricated using silicon-on-insulator (SOI) technologies. SOI technologies also lend themselves to layer-transfer techniques, where the active layer of the SOI is transferred, using bonding and etch-back methods, to a different substrate. This method may have advantages of lower capacitance and higher speed, easier thermal management, and easier access to the body regions of SOI transistors. An example of such a process is described in U.S. Pat. No. 8,357,935 entitled, "Silicon-on-insulator with back side connection", owned by the assignee of the present application and filed on Apr. 28, 2012, which is incorporated herein by reference in its entirety. Layer transfer techniques may also be used to form circuits on fully insulating or transparent substrates, which may be advantageous in opto-electronic applications, for example.

Transferring the active layer of an integrated circuit also can expose the surface of the insulator layer (opposite the active devices) to further processing, if desired. In particular, a full interconnect layer can be formed on this insulator layer surface after the substrate is removed. An interconnect layer so placed may contact the transistor source and drain regions through holes etched in the SOI's insulating layer. This arrangement offers added layout flexibility. Also, this back side interconnect layer provides lower parasitic capacitance when compared to traditional, front-side interconnect layers. Lastly, such an interconnect layer aids in dissipating heat generated by the SOI integrated circuit. The problems with heat dissipation on SOI circuits, and some proposed solutions, are described in U.S. Patent Publication No. 2011/0012199 entitled, "Semiconductor-on-insulator with backside heat dissipation," owned by the assignee of the present application and filed on Jul. 14, 2010, which is incorporated herein by reference in its entirety.

In one embodiment, a full back side SOI interconnect layer connects a plurality of active or reactive devices together, providing a lower cost alternative for providing high performance SOI integrated circuits. Various embodiments include: reducing contact resistance to the back side of the active layer by forming heavily-doped regions through the back side contacts, or etching through the active layer to contact heavily doped or silicided areas on the front surface of the active layer. If the transferred structure can withstand higher temperatures, more process flexibility is possible.

Figure 3:
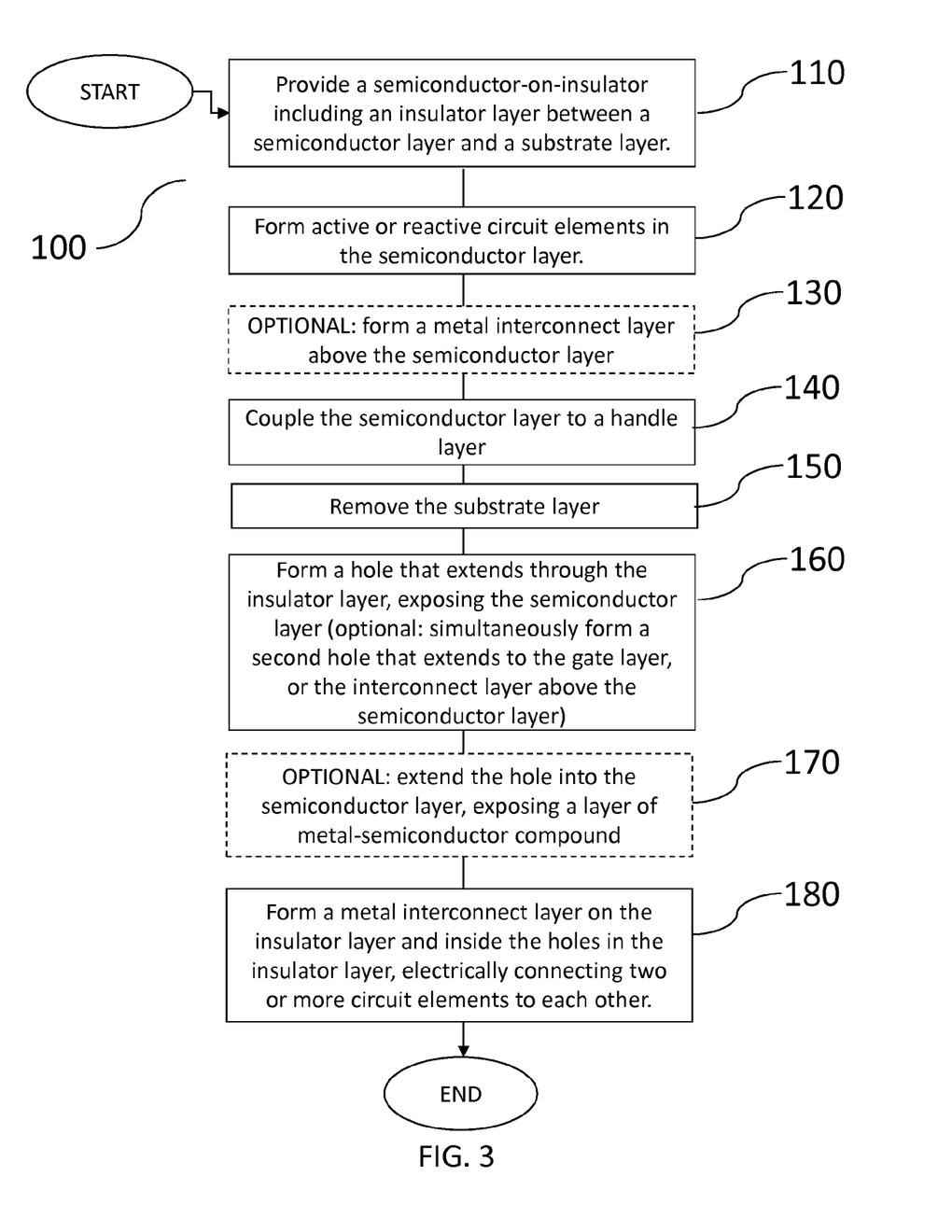
FIG. 3 shows a process flow chart of a method of fabricating an integrated circuit with metal interconnects on the back side of an SOI insulator that is in accordance with a specific embodiment of the present invention.

FIG. 3 illustrates some embodiments of methods of the present disclosure, where a metal interconnect layer is formed on the back side of an SOI integrated circuit. In flowchart 100 of FIG. 3, a semiconductor-on-insulator structure is provided in step 110. This structure includes an insulator layer disposed between a semiconductor layer and a substrate layer. The insulator layer may be, for example, silicon dioxide, which may be 15-1000 nm thick. In step 120, active or reactive circuit elements are formed in the semiconductor layer. Such elements may include, for example, n-channel and p-channel MOS (NMOS and PMOS) transistors. The semiconductor layer may be removed in certain areas—for example, in the isolation areas located between active devices—and replaced with dielectric. These elements may be formed using, for example, a standard CMOS process, or a bi-polar-CMOS (BiCMOS) process, or a process that forms high-power devices or optoelectronic devices in addition to MOS transistors. This process may include forming a metal-semiconductor compound on regions of the semiconductor layer; for example, on the source and drain regions of the MOSFETs. Such a compound would reduce the sheet resistance of these regions. If the semiconductor layer comprises silicon, the metal-semiconductor compound may comprise, for example, titanium silicide, cobalt silicide, or nickel silicide. In step 130, a metal interconnect layer is optionally formed above the semiconductor layer. This layer may electrically connect to the circuit elements formed in the semiconductor layer. This layer may be formed using a subtractive, or Damascene, process, or it may be formed using an additive process. This layer may be comprised, for example, of a refractory metal, for example, tungsten.

In step 140 of FIG. 3, a handle layer is coupled to the semiconductor layer of the SOI structure. The handle layer could be any rigid or semi-rigid support, for example, a silicon wafer. Any suitable coupling or bonding method that results in a permanent bond may be used; for example direct or fusion bonding, permanent adhesive bonding, metallic interdiffusion or eutectic bonding. If a front-side interconnect layer is used (step 130), it may be advantageous for bonding purposes to use a Damascene process to form this layer, since a planar surface will result. A bonding layer, for example, silicon dioxide, may be deposited on the SOI structure, or the handle layer, or both. This layer may be deposited using, for example, chemical vapor deposition (CVD). In step 150, the substrate layer of the SOI is removed. This could be done by using, for example, mechanical and chemical means independently or in combination.

Still referring to FIG. 3, in step 160, a hole is etched in the exposed surface of the insulator layer. This hole extends through the insulator layer, from one surface to the opposite surface. This may be accomplished, for example, by forming the hole pattern in a photoresist using photolithography, and etching the insulator layer in an RIE or plasma etch chamber, or using hydrofluoric acid (HF). After the hole is formed, the semiconductor layer surface is exposed inside the hole. During the etching step 160, another hole that extends to a transistor gate layer, or to the (optional) interconnect layer formed in step 130, may be formed. Such a hole could be formed, for example, through the dielectric isolation areas between the active or reactive devices. All of these different types of holes—those extending to the semiconductor layer, a gate layer, or an interconnect layer—are etched through the same material (for example, silicon dioxide). Thus, they can all be etched in the same step 160. In step 170, the hole extending to the semiconductor layer may optionally be extended into the semiconductor. The etching may stop at the metal-semiconductor compound layer, if present. This etching process may be done in a dry-etch chamber, using a chemistry that will etch the semiconductor faster than the metal-semiconductor compound. For example, for a silicon layer with nickel silicide formed on the front surface, an $SF_6+O_2$ etch will etch the silicon but not etch the nickel silicide.

In step 180 of FIG. 3, a metal interconnect layer is formed on the back side of the insulator and inside the hole formed in step 160. This metal interconnect layer could comprise, for example, tungsten plugs, aluminum, copper, or a combination of these. It could be formed by standard patterning techniques; for example, depositing the metal, patterning with a photoresist, and etching the metal. The resulting pattern will connect two or more of the devices formed in the semiconductor layer to each other. If there are holes formed in step 160 that extend to a gate layer or a front-side metal interconnect layer (if step 130 is performed), then an electrical connection can be formed between the back side metal formed in step 180 and a gate or front side metal layer.

Figure 4A:
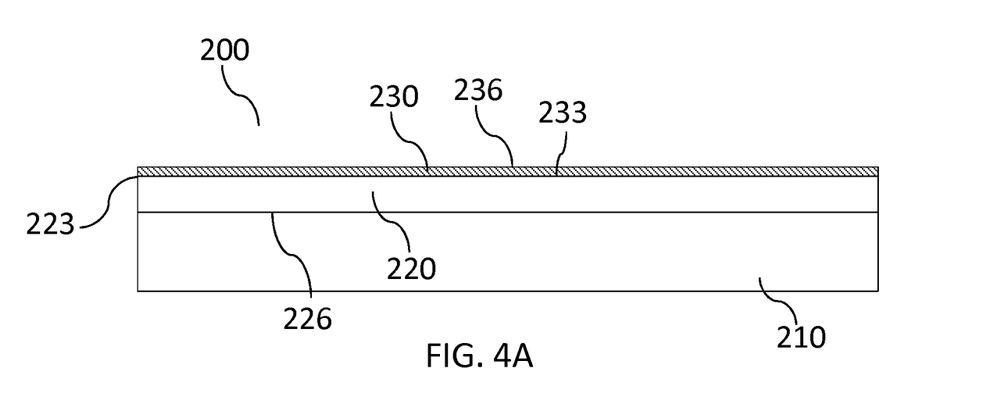
FIGS. 4A-G show cross-sectional views of stages of forming interconnect on the back side of an SOI circuit, according to some embodiments.

FIGS. 4A-G illustrate an exemplary back side SOI structure fabricated according to the method of FIG. 3. In FIG. 4A, an SOI structure 200, having a substrate layer 210, an insulating layer 220, and a semiconductor layer 230, is provided. The insulating layer 220 has a first surface 223 (in contact with the semiconductor layer 230) and a second surface 226 in contact with the substrate 210. The semiconductor layer 230 has a first surface 233 (in contact with the first surface 223 of the insulating layer 220) and a second surface 236. The insulating layer may be comprised of, for example, silicon dioxide, and it may be, for example, between 10 and 1000 nm thick, for example, between 15 and 70 nm thick, or between 150 and 350 nm thick, or between 500 and 750 nm thick. The semiconductor layer may be comprised of, for example, silicon, or a III-V semiconductor such as GaAs, or a strained semiconductor alloy such as SiGe.

Figure 4B:
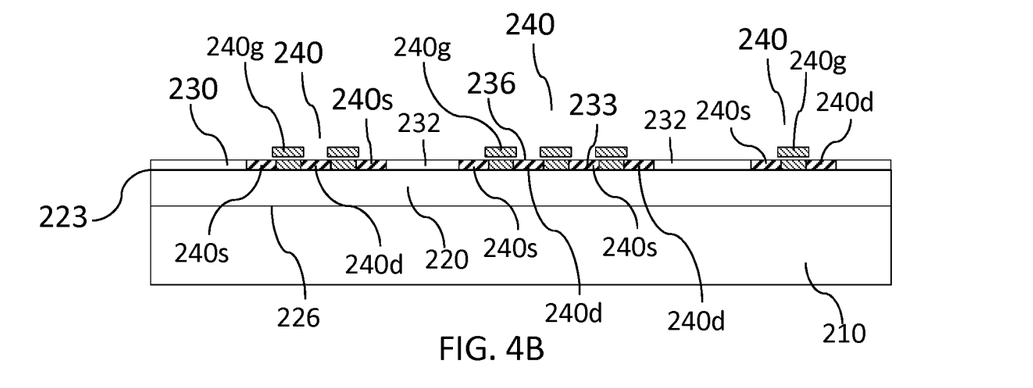

In FIG. 4B, circuit elements, for example, transistors 240, are formed in the semiconductor layer. These transistors 240 comprise source 240s and drain 240d regions, and gate layers 240g, and are separated by isolation regions 232. These elements may be formed as described for step 120 in FIG. 3 above; that is, using, for example, a standard CMOS process, or a bi-polar-CMOS (BiCMOS) process. Other circuit elements may be formed in addition to, or instead of, CMOS transistors 240, for example, high-power devices, optoelectronic devices, or other passive or reactive elements.

The source 240s and drain 240d regions in FIG. 4B comprise areas of the semiconductor layer that are heavily doped, in comparison, for example, to the transistor channel regions underneath the gates 240g. The high doping level is important, for example, to allow good electrical contact to these regions. If the semiconductor layer is thin enough—for example, less than 100 nm, or less than 70 nm, or less than 50 nm—the source and drain heavily-doped regions may extend through the full thickness of the semiconductor layer, as shown in FIG. 4B. Note also that the source 240s and drain 240d regions of transistors 240 may be raised above the surface 236 of the semiconductor layer 230. Such a structure is often used for fully-depleted SOI processes, which are built on very thin semiconductor layers, for example, less than 20 nm, or less than 10 nm, or between 5 and 7 nm.

Figure 4C:
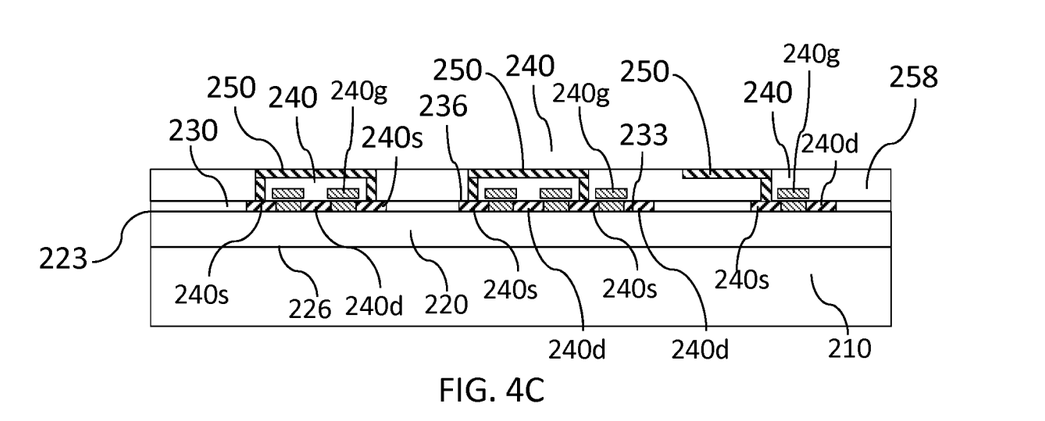
Figure 4D:
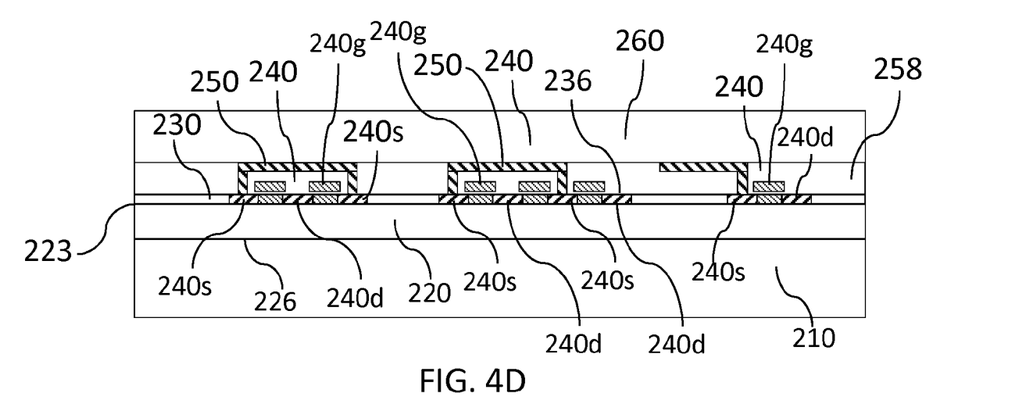

FIG. 4C shows a front metal interconnect layer 250 optionally coupled to the second surface 236 of the semiconductor layer 230, and above the circuit elements (transistors 240) fabricated therein. If present, this interconnect layer 250 may connect, for example, to the source regions 240s of the transistors 240. A subtractive, or Damascene, process may be used to form optional interconnect layer 250. Interconnect layer 250 may comprise a high-temperature capable interconnect, for example, a refractory metal, for example, tungsten. Alternatively, interconnect layer 250 may comprise a conventional low-resistivity material, for example, copper or aluminum, or it may comprise a combination of high-temperature-capable interconnect and low-resistivity material, for example tungsten plugs with aluminum or copper metal. An inter-level dielectric layer 258 separates the optional front metal interconnect layer 250 from the devices 240 formed in the semiconductor layer 230. In FIG. 4D, a handle layer 260 is coupled to the surface 236 of the semiconductor layer 230, with inter-level dielectric layer 258 and front interconnect layer 250, if present, intervening. As shown in FIG. 4D, handle layer 260 is bonded above interconnect layer 250, if present. As described in step 140 of FIG. 3, the handle layer could be any rigid or semi-rigid support, for example, a silicon wafer, and any suitable coupling or bonding method that results in a permanent bond may be used; for example direct or fusion bonding, or permanent adhesive bonding. A bonding layer (not shown), for example, deposited silicon dioxide, may be formed on the either, or both, of the bonded surfaces.

Figure 4E:
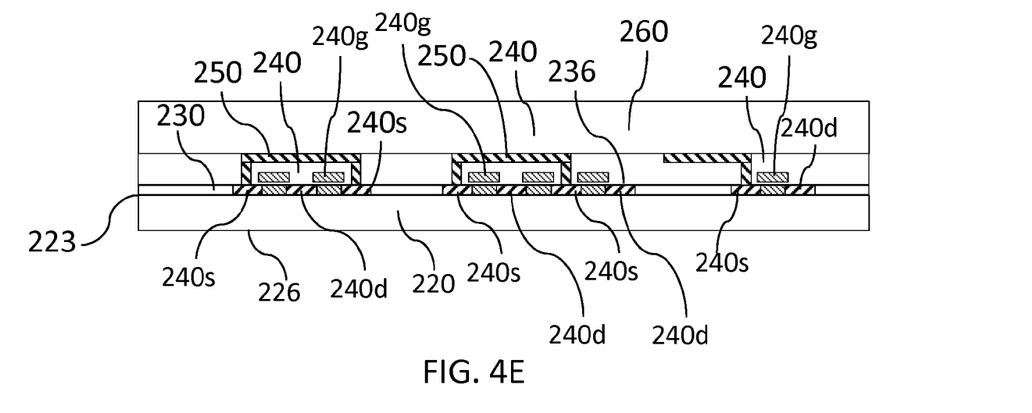
Figure 4F:
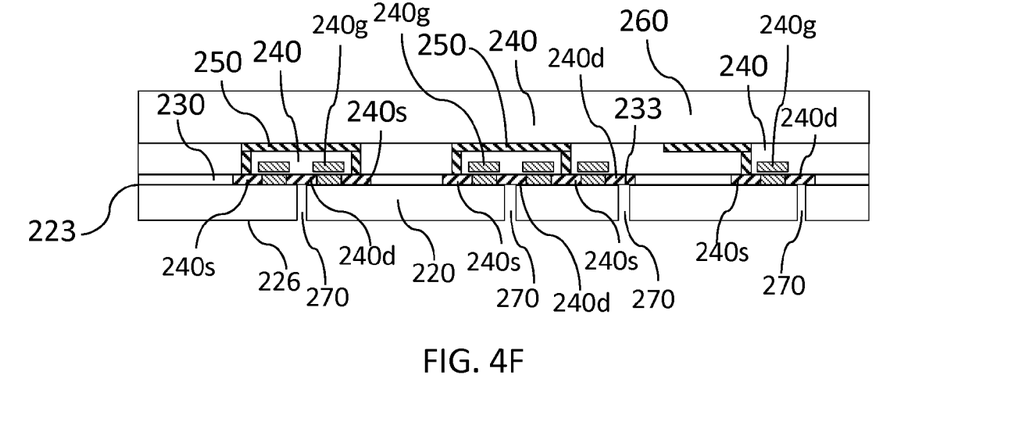

In FIG. 4E, the substrate 210 of the SOI structure has been removed, by using, for example, mechanical and chemical means independently or in combination. This step exposes the surface 226 of the insulator layer 220. In FIG. 4F, holes 270 have been etched through the insulator layer 220, exposing regions of the surface 233 of the semiconductor layer 230. These holes can be formed by any standard patterning technique as described above for step 160 in FIG. 3, for example, photolithographic patterning of a resist layer followed by dry etching of the insulator layer 220. These holes may expose, for example, the drain regions 240d of transistors 240. Holes could also expose, for example, source or body regions of CMOS transistors, or collector regions of vertical bipolar transistors, or collector, base, or emitter regions of lateral bipolar transistors.

Figure 4G:
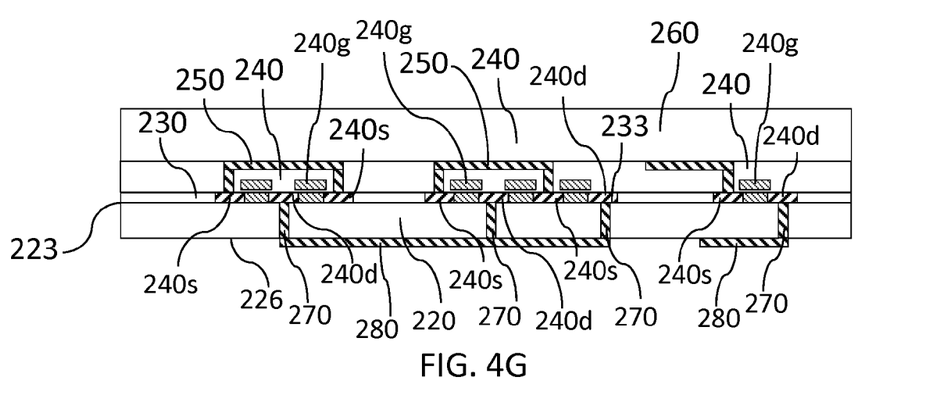

Turning to FIG. 4G, a back side metal interconnect layer 280 is formed on the surface 226 of insulator layer 220 and inside the holes 270. As described in step 170 of FIG. 3, this metal interconnect layer could comprise, for example, aluminum, copper, tungsten, or a combination of these. It could be formed by standard patterning techniques; for example, an additive process, or a subtractive process. The back side metal layer 280 may connect two or more transistors 240 to each other. For example, as shown in FIG. 4G, back side metal layer 280 may connect some of the drains 240d of transistors 240 together.

Figure 5:
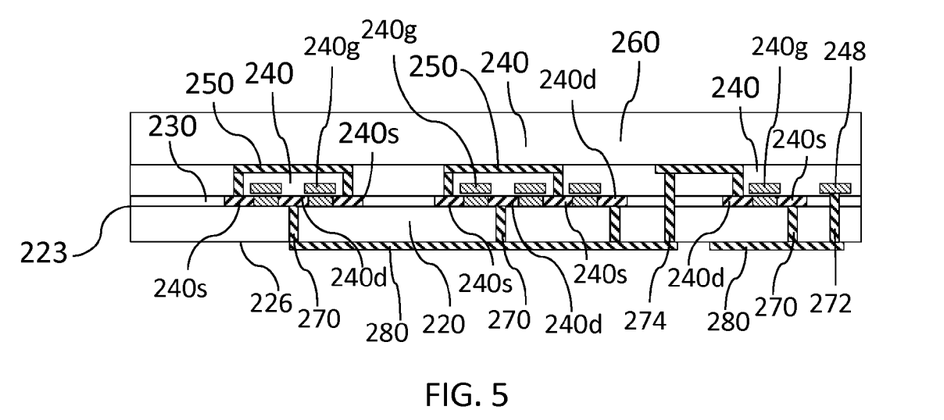
FIG. 5 shows a cross-sectional view of another embodiment, wherein multiple types of back contacts are formed.

FIG. 5 shows an alternative structure that may be formed using the process according to the method of FIG. 3. In FIG. 5, other holes 272 and 274 are formed, in addition to holes 270. Both holes 272 and 274 are formed over isolation regions between transistors 240. Hole 272 extends to a gate region 248 that extends over the isolation region, and hole 274 extends to the optional front metal interconnect layer 250. Holes 272 and 274 may be formed simultaneously with holes 270; that is, in the same masking step. Alternatively, separate masking steps may be used for the different types of contact holes, for example, if it is desired that the overetch of the semiconductor layer inside holes 270 be minimized. In this structure, the back side interconnect is electrically connected to the optional front side interconnect, or the transistor gate layer, or both. This can allow greater layout flexibility and thus cost savings.

Figure 6:
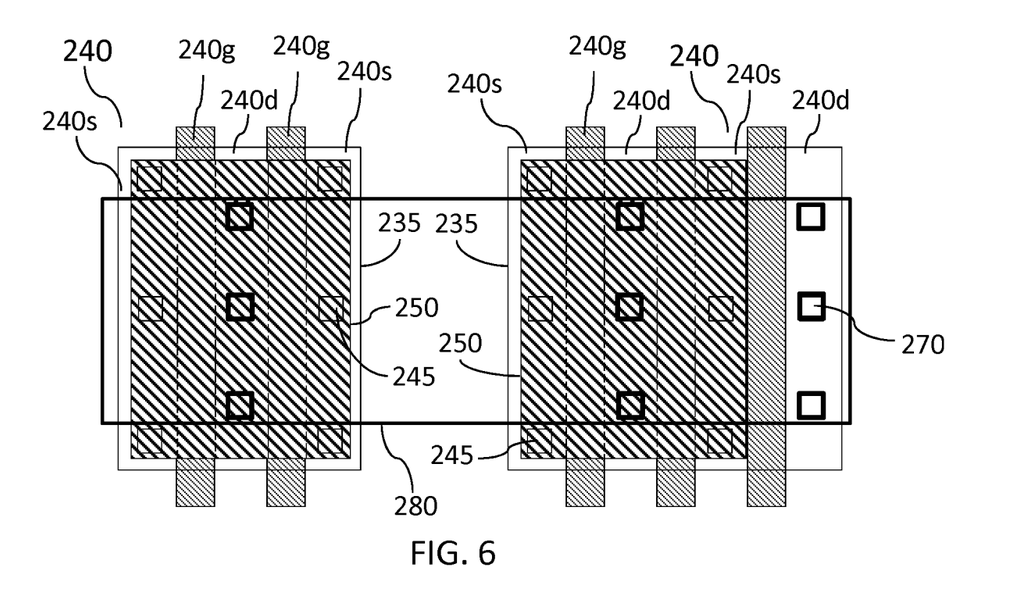
FIG. 6 shows a layout of an SOI integrated circuit using back side interconnect that is in accordance with a specific embodiment of the present invention.

FIG. 6 shows an example layout that utilizes the area-saving features of this invention. As in FIG. 2, gate fingers 240g and isolation edges 235 define transistors 240. Transistors 240 further comprise drain regions 240d and source regions 240s. A front side metal interconnect layer 250 connects the source regions 240s together through contacts 245. Note that there is no connection between interconnect layer 250 and the drain regions 240d; therefore, the metal layer 250 connecting the source regions 240s can be drawn overlapping the drain regions 240d without going outside of the transistor area. Drain regions 240d are connected through back side holes (or vias) 270 to back side interconnect layer 280. In this way, the area of this integrated circuit can be reduced compared to the prior art shown in FIG. 2.

Figure 7A:
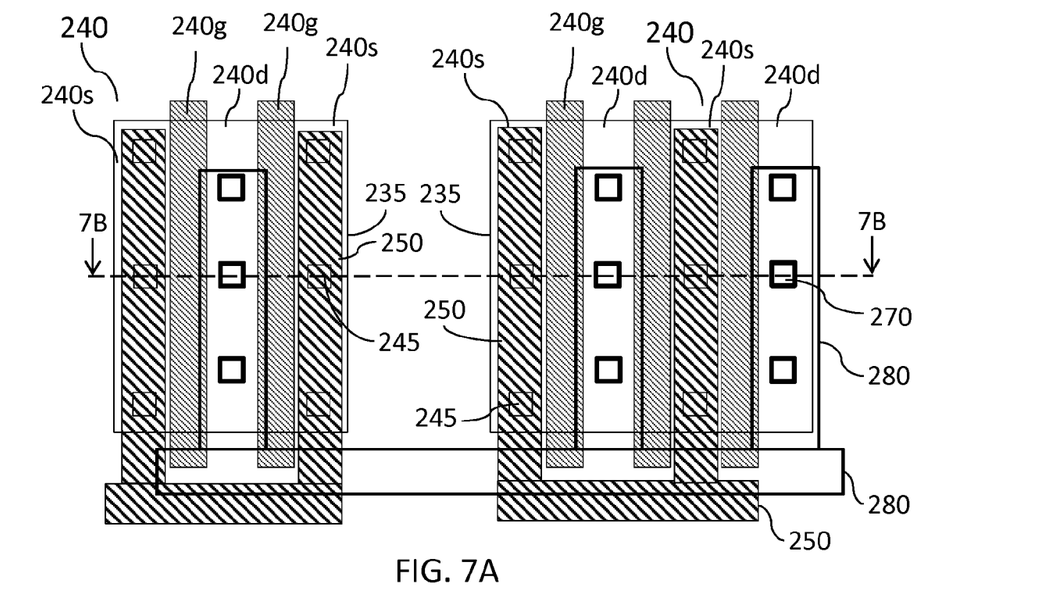
FIGS. 7A-B show an alternative layout and cross section of an SOI integrated circuit using back side interconnect that is in accordance with a specific embodiment of the present invention.
Figure 7B:
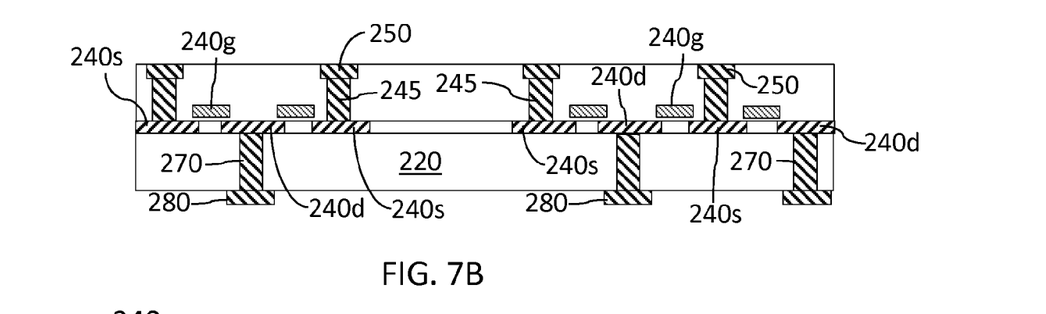

FIG. 7A shows an example layout for the reduction of parasitic capacitance. Again, gate fingers 240g and isolation edges 235 define the source 240s and drain 240d regions of transistors 240. Front side metal 250 is again connected to the source regions 240s through contacts 245. Back side metal 280 is connected to drain regions 240d through back side vias 270. So as to reduce gate-to-source (off-state) capacitance, the source metal 250 is not drawn overlapping the drain regions 240d, and the back side drain metal 280 is not drawn overlapping the source regions 240s. Thus, the interconnect contribution to the parasitic off-state capacitance is limited to the area of overlap of the back side metal 280 and front side metal 250 layers. However, this capacitance is much reduced compared to the case of FIG. 2, since the two layers are more separated vertically. FIG. 7B shows a cross sectional view of the layout illustrated in FIG. 7A. This figure clearly shows how the front side source metal 250 and the back side drain metal 280 are separated from each other as far as they can be.

Figure 8:
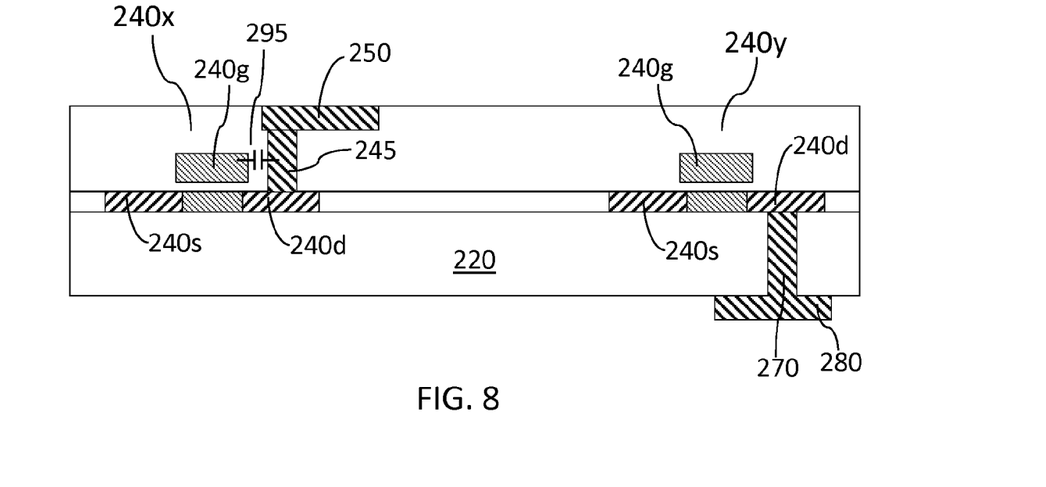
FIG. 8 shows a cross-sectional view of transistors formed using an embodiment of the current invention, illustrating differences in parasitic capacitances.

Using this embodiment, where the back side metal 280 connects to drain regions 240d, the gate-to-drain capacitance is also reduced. FIG. 8 shows a cross section of two transistors 240x and 240y fabricated using an embodiment of the current invention. Transistor 240x has its drain 240d contacted from the front, and transistor 240y has its drain 240d contacted from the back. The gate-drain capacitance for transistor 240x includes as a component the capacitance 295 between the front contact 245 and the gate 240g. However, for the back-contacted transistor 240y, there is no such capacitance adding to the total gate-drain capacitance. Thus, the total gate-drain capacitance is reduced for transistors with back-contacted drains.

Note also that, in the transistor layouts (FIG. 6 and FIG. 7), the transistors 240 may be more compacted in the direction perpendicular to the gate fingers 240g, compared to layouts using standard processes (e.g., FIG. 2). This is the case if the minimum front-side contacted metal pitch is greater than the minimum contacted transistor source/drain pitch, which would make the layout of FIG. 2 metal-pitch limited. As shown in FIGS. 6 and 7, the number of front side metal pitches needed to contact the sources and drains of the transistors 240 is reduced by about a factor of 2.

Figure 9A:
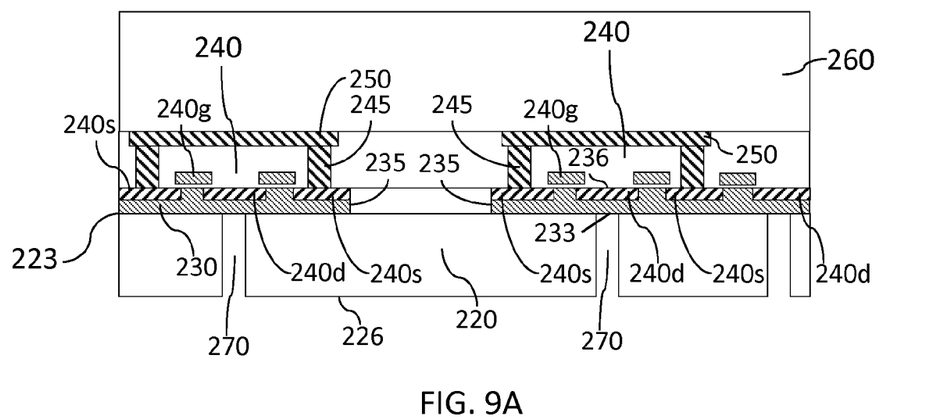
FIGS. 9A-C show cross-sectional views of stages of forming back side diffusions and interconnect, according to some embodiments.
Figure 9B:
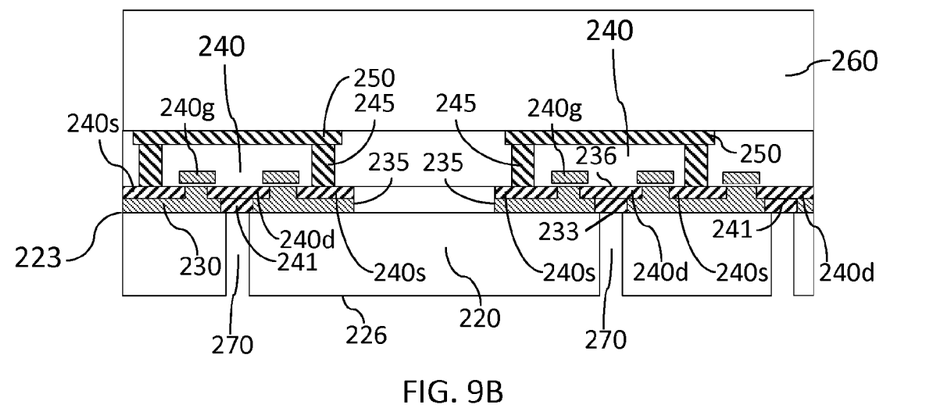
Figure 9C:
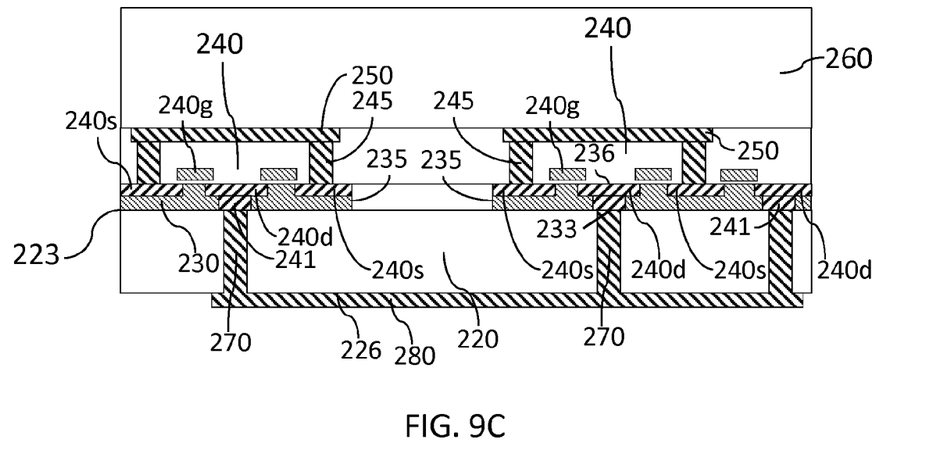

FIGS. 9A-C illustrate an alternative embodiment of an SOI back side metal interconnect. FIG. 9A shows an SOI integrated circuit, with transistors 240 and front-side interconnect layer 250, bonded to handle layer 260. Heavily doped source regions 240s and drain regions 240d do not extend through to the back surface 233 of semiconductor layer 230. Holes 270 have been etched in insulator layer 220 to expose surface 233 of semiconductor layer 230. In FIG. 9B, dopant has been introduced inside holes 270 to form doped regions 241, of the same dopant type as drain regions 240d. Regions 241 effectively extend drain regions 240d to the back surface 233 of semiconductor layer 230, and allow the drain regions 240d to be contacted through back side holes 270. Doped regions 241 may be formed by, for example, implanting dopant ions through holes 270, as described in U.S. Patent Publication No. 2012/0088339 A1 entitled, "Vertical Semiconductor Device with Thinned Substrate," owned by the assignee of the present application and filed on Oct. 11, 2011, which is incorporated herein by reference in its entirety. Alternatively, doped regions 241 may be formed by exposing the structure to a dopant-species-containing ambient (for example, $POCl_3$) at a high temperature (for example, greater than 800° C.). If ion implantation is used, it may be followed by an annealing process to activate the dopant, for example, a rapid thermal anneal at a temperature of 800 to 1000° C. for 1 to 60 seconds. Note that, if a high temperature process is used for this step, it would be advantageous to use a high temperature metal for the front side metal interconnect layer 250, if this layer is used. For example, it would be advantageous if a refractory metal, for example, tungsten, were used for front side metal interconnect 250.

In FIG. 9C, a back side metal interconnect layer 280 is formed on the surface 226 of insulator layer 220 and inside the holes 270, contacting doped region 241 connected to drain regions 240d. This metal interconnect layer could comprise, for example, tungsten, aluminum, copper, or a combination of these. This interconnect layer may, as shown in FIG. 9C connect the drains 240d of transistors 240 together, through back side vias 270 and doped regions 241.

The process described in FIGS. 9A-B provide a means of forming a back-side interconnect contacting drain or source regions, when these regions do not extend to the back side of the semiconductor layer. This may be the case, for example, if the semiconductor layer is greater than 200 nm thick, or greater than 100 nm thick, or greater than 70 nm thick.

Figure 10A:
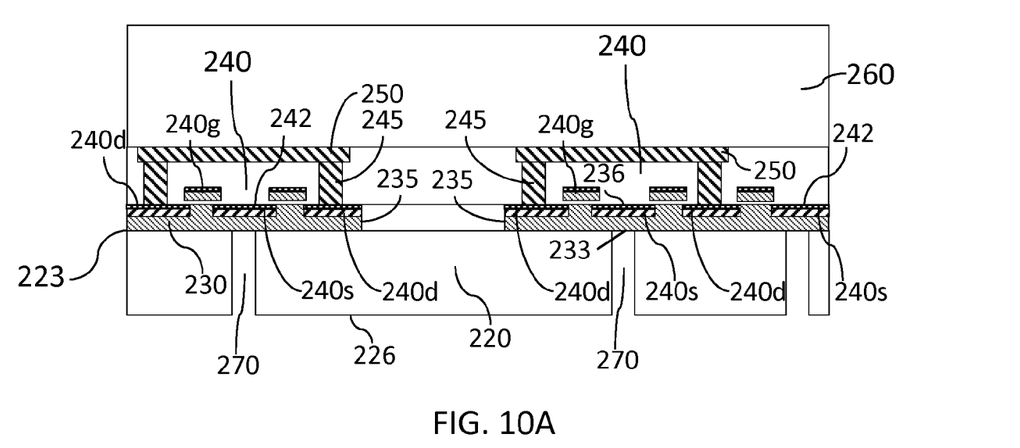
FIGS. 10A-C show cross-sectional views of stages of forming back side contacts and interconnect, according to some embodiments.
Figure 10B:
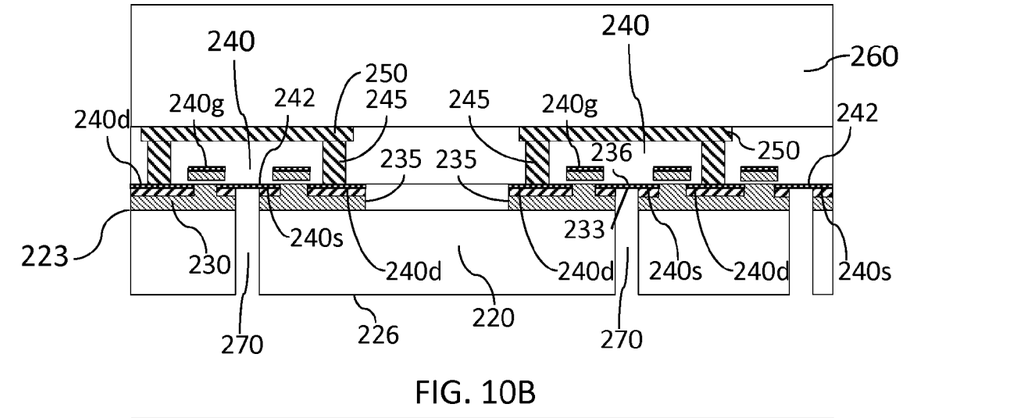
Figure 10C:
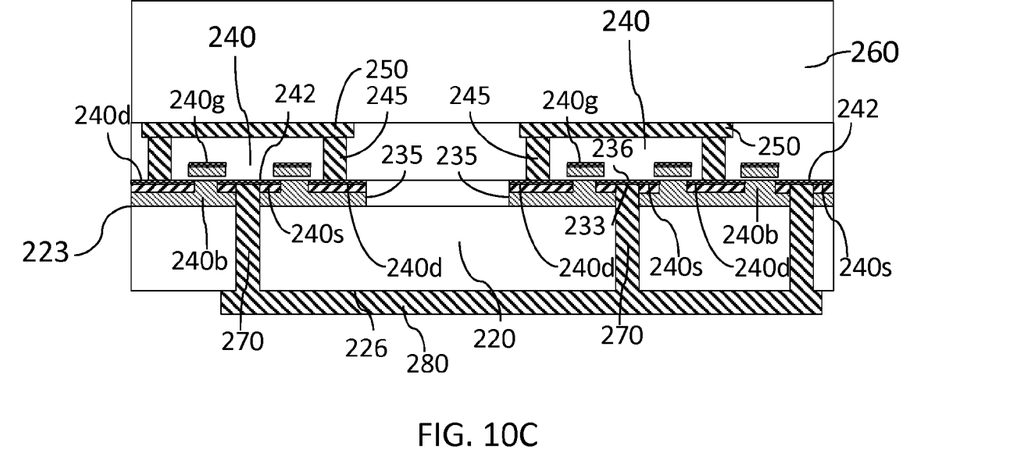

FIGS. 10A-C illustrate another alternative embodiment of an SOI back side metal interconnect. FIG. 10A shows an SOI integrated circuit, with transistors 240 and front-side interconnect layer 250, bonded to handle layer 260. Heavily doped source regions 240s and drain regions 240d do not extend through to the back surface 233 of semiconductor layer 230. Moreover, regions of a metal-semiconductor compound 242 have been formed on the surfaces of the drain regions 240d, source regions 240s, and gate regions 240g of transistors 240. These metal-semiconductor compounds are often used to reduce the sheet resistance and contact resistance of these regions. If the semiconductor layer comprises silicon, the metal-semiconductor compound may comprise, for example, titanium silicide, cobalt silicide, or nickel silicide. These regions are often referred to as "self-aligned silicide", or "SAlicide", regions.

Still referring to FIG. 10A, holes 270 have been etched in insulator layer 220 to expose surface 233 of semiconductor layer 230. In FIG. 10B, the holes 270 have been extended into the semiconductor layer 230 to contact the back side of the metal-semiconductor compound regions 242. This etching process may be done in a dry-etch chamber, using a chemistry that will etch the semiconductor faster than the metal-semiconductor compound. For example, for a silicon layer with nickel silicide formed on the front surface, an $SF_6+O_2$ etch will etch the silicon but not etch the nickel silicide. In FIG. 10C, a back side metal interconnect layer 280 is formed on the surface 226 of insulator layer 220 and inside the holes 270, contacting metal-semiconductor compound regions 242 electrically connected to source regions 240s. This metal interconnect layer could comprise, for example, tungsten, aluminum, copper, or a combination of these.

The structure of FIG. 10C offers several advantages. For example, the transferred semiconductor layer 230 does not need to be exposed to high temperature steps (e.g., to activate dopants), so that low-resistivity, low-temperature metals (e.g., aluminum or copper) may be used for the front-side metal interconnect layer, if present. Also, the hole 270 filled with interconnect metal 280 contacting the metal-semiconductor compound region 242 together provide an excellent thermal path for efficient transfer of heat from active devices 240. Finally, the contact resistance between the metal-filled hole 270 and the metal-semiconductor compound 242 may be advantageously lower than the metal-semiconductor contact resistance between metal-filled holes 270 and the silicon surface 233 (FIG. 4G and FIG. 9C).

In FIG. 10C, the back side interconnect layer 280 is shown connecting transistor sources 240s rather than transistor drains 240d. In this structure as shown, there may be some conduction between the metal filling the hole 270 and the body region 240b of the transistor 240. Thus, in FIG. 10C, the sources and body regions of transistors 240 may be effectively shorted together. For many circuits, especially digital circuits, this is desired. For these types of circuits, then, this structure may offer a layout advantage, since a separate body contact is not necessary.

The process described in FIGS. 10A-C may also be used in combination with the process wherein the diffused regions reach the back side of the semiconductor layer 230 (FIGS. 4A-G). This may be advantageous, for example, in cases a lower drain contact resistance is desired. This structure is also less susceptible to unintended conduction between the metal filling the holes 270 and the body regions of transistors 240, so, for example, analog or other circuits, where source-body ties are not necessarily desired, may be implemented.

The back-side interconnect processes described herein are applicable to many different types of SOI fabrication processes, for example, fully-depleted or partially-depleted SOI processes. Also, multiple layers of metal interconnect may be used on the front or back side of the transferred layer, by, for example, repeating the applicable steps described herein.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. A semiconductor-on-insulator integrated circuit comprising:
   a buried insulating layer, wherein the buried insulating layer has a first surface, a second surface, and a hole extending from the first surface to the second surface;
   a semiconductor layer having a first surface and a second surface, wherein the first surface of the semiconductor layer contacts the first surface of the buried insulating layer;
   a handle layer formed over the semiconductor layer;
   a first transistor formed in the semiconductor layer;
   a first contact to a first doped region of the first transistor,
   a second contact to a second doped region source or drain region of the first transistor;
   a first metal interconnect layer in contact with the second surface of the buried insulating layer, wherein the metal interconnect layer is disposed within the hole in the buried insulating layer and is in contact with the first contact; and
   a second metal interconnect layer located, at least partially, on an opposite side of the semiconductor layer from the first metal interconnect layer, wherein the second metal interconnect layer is in contact with the second contact;
   wherein the first and second doped regions are the source and drain regions of a transistor; and
   wherein a channel of the first transistor lies wholly within an overlapping vertical extent of the source region and the drain region.

2. The integrated circuit of claim 1, wherein:
   a first vector defining a current flow through the first contact is in a same direction as a second vector defining the current flow through the second contact; and
   a third vector defining a current flow through a channel of the first transistor is normal to the first and second vectors.

3. The integrated circuit of claim 1, wherein:
   an off state capacitance of the transistor is reduced by having the first and second contacts being located on opposite sides of the semiconductor layer.

4. The integrated circuit assembly of claim 1, wherein:
   the first doped region is a drain of the first transistor;
   the second doped region is a source of the first transistor;
   a second transistor shares the first contact as a common drain contact with the first transistor and does not share the second contact with the first transistor; and
   a third transistor shares the second contact as common source contact with the first transistor and does not share the first contact with the first transistor.

5. The integrated circuit assembly of claim 3,
   wherein the first, second, and third transistors serve in combination as fingers of a single transistor.

6. The integrated circuit assembly of claim 4,
wherein the first, second, and third transistors are each formed at least partially within a common set of isolation edges.

7. The integrated circuit assembly of claim 1, wherein
the hole in the insulator lies wholly within a lateral extent of the drain of the first transistor; and
the first contact lies wholly within a lateral extent of the source of the first transistor.

8. The integrated circuit assembly of claim 1, further comprising:
a metal silicide region formed on the second surface of the semiconductor layer;
wherein the hole in the buried insulating layer extends through the semiconductor layer to expose the metal silicide region; and
wherein the first contact is in contact with the metal silicide region.

9. The integrated circuit assembly of claim 1, wherein:
the hole in the buried insulating layer exposes the first surface of the semiconductor layer; and
the first contact is formed on the first surface of the semiconductor layer.

10. The integrated circuit assembly of claim 9, wherein:
the first contact is in contact with a heavily doped region of the semiconductor layer; and
the heavily doped region extends from the drain region to the first surface of the semiconductor layer.

11. An integrated circuit comprising:
an insulating layer of a semiconductor-on-insulator wafer, wherein the insulating layer has a first surface, a second surface, and a hole extending from the first surface to the second surface;
a semiconductor layer having a first surface and a second surface, the first surface of the semiconductor layer contacting the first surface of the insulating layer;
a first contact to a first doped region of the semiconductor layer, wherein a first device formed in the semiconductor layer comprises the first doped region;
a second contact to a second doped region of the semiconductor layer, wherein the first device formed in the semiconductor layer comprises the second doped region;
a first metal interconnect layer in contact with the second surface of the insulating layer, the metal interconnect layer being disposed within the hole in the insulating layer and being in contact with the first contact;
a second metal interconnect layer located on an opposite side of the semiconductor layer from the first metal interconnect layer and being in contact with the second contact; and
a second device formed in the semiconductor layer, wherein the second device shares the first contact with the first device;
wherein the first doped region is a source or a drain of the first device; and
wherein a channel of the first device lies wholly within an overlapping vertical extent of the first and second doped regions.

12. The integrated circuit of claim 11, further comprising:
a third device formed in the semiconductor layer that shares the second contact with the first device and does not share the first contact with the first device;
wherein the second device does not share the second contact with the first device.

13. The integrated circuit assembly of claim 12, wherein the first, second, and third devices are field-effect transistors;
the first doped region is a drain of the first device;
the second doped region is a source of the first device;
the first contact and the second contact are on opposite sides of the semiconductor layer; and
the first and second metal interconnect layers have mutually exclusive vertical extents.

14. The integrated circuit assembly of claim 12,
wherein the first, second, and third devices serve in combination as fingers of a single transistor.

15. The integrated circuit assembly of claim 14,
wherein the first, second, third devices are each formed at least partially within a common set of isolation edges.

16. The integrated circuit assembly of claim 12, further comprising:
a third contact to a third doped region of the semiconductor layer, wherein the third device comprises the third doped region;
wherein the first, second, and third devices each comprise field-effect transistors and serve in combination as fingers of a single transistor;
wherein the second metal interconnect layer is in contact with the third contact; and
wherein the first metal interconnect layer serves as a common drain connection for the first and second devices.

17. The integrated circuit assembly of claim 11, wherein
the hole in the insulator lies wholly within a lateral extent of the first doped region; and
the second contact lies wholly within a lateral extent of the second doped region.

18. The integrated circuit assembly of claim 11, further comprising:
a metal silicide region formed on the second surface of the semiconductor layer;
wherein the hole in the insulating layer extends through the semiconductor layer to expose the metal silicide region; and
wherein the first contact is in contact with the metal silicide region.

19. The integrated circuit assembly of claim 11, wherein:
the hole in the insulating layer exposes the first surface of the semiconductor layer; and
the first contact is formed on the first surface of the semiconductor layer.

20. The integrated circuit assembly of claim 19, wherein:
the first doped region is a drain of the first device;
the first contact is in contact with a heavily doped region of the semiconductor layer; and
the heavily doped region extends from the drain region to the first surface of the semiconductor layer.

21. An integrated circuit comprising:
a buried insulating layer of a semiconductor-on-insulator wafer, wherein the buried insulating layer has a first surface, a second surface, and a hole extending from the first surface to the second surface;
a semiconductor layer having a first surface and a second surface, the first surface of the semiconductor layer contacting the first surface of the buried insulating layer;
a first field-effect transistor formed in the semiconductor layer;
a first contact to a drain of the first field-effect transistor;
a second contact to a source of the first field-effect transistor;
a first metal interconnect layer in contact with the second surface of the buried insulating layer, the metal interconnect layer being disposed within the hole in the buried insulating layer and being in contact with the first contact; and a second metal interconnect layer located on an opposite side of the semiconductor layer from the first metal interconnect layer and being in contact with the second contact;

wherein a second field-effect transistor shares the first contact with the first field-effect transistor and does not share the second contact with the first field-effect transistor; and wherein a third field-effect transistor shares the second contact with the first field-effect transistor and does not share the first contact with the first field-effect transistor.

22. The integrated circuit of claim 21, wherein a channel of the first field-effect transistor lies wholly within an overlapping vertical extent of the drain and the source.

23. The integrated circuit assembly of claim 21, wherein the first contact and the second contact are on opposite sides of the semiconductor layer; and wherein the first and second metal interconnect layers have mutually exclusive vertical extents.

24. The integrated circuit assembly of claim 21, wherein the first, second, and third field-effect transistors act in combination as fingers of a single transistor.

25. The integrated circuit assembly of claim 24, wherein the first, second, third field-effect transistor are each formed at least partially within a common set of isolation edges.

26. The integrated circuit assembly of claim 21, further comprising:

a third contact to a separate source of the semiconductor layer, wherein the third field-effect transistor comprises the third doped region;

wherein the first, second, and third field-effect transistors act in combination as fingers of a single transistor;

wherein the second metal interconnect layer is in contact with the third contact; and wherein the first metal interconnect layer serves as a common drain connection for the first and second field-effect transistors.

27. The integrated circuit assembly of claim 21, wherein the hole in the insulator lies wholly within a lateral extent of the drain; and the second contact lies wholly within a lateral extent of the source.

28. The integrated circuit assembly of claim 21, further comprising:

a metal silicide region formed on the second surface of the semiconductor layer;

wherein the hole in the buried insulating layer extends through the semiconductor layer to expose the metal silicide region; and wherein the first contact is in contact with the metal silicide region.

29. The integrated circuit assembly of claim 21, wherein:

the hole in the buried insulating layer exposes the first surface of the semiconductor layer; and the first contact is formed on the first surface of the semiconductor layer.

30. The integrated circuit assembly of claim 29, wherein:

the first contact is in contact with a heavily doped region of the semiconductor layer; and the heavily doped region extends from the drain to the first surface of the semiconductor layer.

\* \* \* \* \*